(12) United States Patent   (10) Patent No.: US 7,417,194 B2
Shrier                          (45) Date of Patent:     Aug. 26, 2008

(54) ESD PROTECTION DEVICES AND METHODS OF MAKING SAME USING STANDARD MANUFACTURING PROCESSES

(75) Inventor: Karen P. Shrier, Half Moon Bay, CA (US)

(73) Assignee: Electronic Polymers, Inc., Round Rock, TX (US)

( * ) Notice: Subject to any disclaimer, the term of this patent is extended or adjusted under 35 U.S.C. 154(b) by 214 days.

(21) Appl. No.: 10/875,372

(22) Filed: Jun. 24, 2004

(65) Prior Publication Data

US 2005/0083163 A1    Apr. 21, 2005

Related U.S. Application Data

(62) Division of application No. 10/366,174, filed on Feb. 13, 2003, now Pat. No. 6,981,319.

(51) Int. Cl.
    H05K 1/00    (2006.01)
(52) U.S. Cl. ........................ 174/254; 361/748
(58) Field of Classification Search ................ 174/254, 174/261–266; 361/748–751
    See application file for complete search history.

(56) References Cited

U.S. PATENT DOCUMENTS

| 4,726,991 A | 2/1988 | Hyatt et al. ............... 428/329 |
|---|---|---|
| 4,977,357 A | 12/1990 | Shrier .......................... 338/21 |
| 5,068,634 A | 11/1991 | Shrier .......................... 338/21 |
| 5,099,380 A | 3/1992 | Childers et al. ............... 361/56 |
| 5,248,517 A | 9/1993 | Shrier et al. .................. 427/58 |
| 5,807,509 A | 9/1998 | Shrier et al. ................. 252/512 |
| 5,834,824 A * | 11/1998 | Shepherd et al. ............ 257/530 |
| 5,955,762 A * | 9/1999 | Hively ........................ 257/355 |
| 5,962,815 A * | 10/1999 | Lan et al. .................... 174/262 |
| 6,172,590 B1 | 1/2001 | Shrier et al. .................. 338/20 |
| 6,239,687 B1 | 5/2001 | Shrier et al. .................. 338/21 |
| 6,310,752 B1 | 10/2001 | Shrier et al. .................. 361/56 |
| 6,534,422 B1 * | 3/2003 | Ichikawa et al. ............ 438/780 |
| 6,542,065 B2 | 4/2003 | Shrier et al. .................. 338/21 |
| 6,657,532 B1 | 12/2003 | Shrier et al. .................. 338/21 |
| 2004/0160300 A1 | 8/2004 | Shrier ......................... 337/16 |

* cited by examiner

*Primary Examiner*—Jeremy C Norris
(74) *Attorney, Agent, or Firm*—Fish & Richardson P.C.; James W. Babineau; David Hoffman

(57) ABSTRACT

Devices capable of protecting electronic components during the occurrence of a disturbance event using printed circuit board manufacturing techniques. A three (3) layer structure is formed comprising a polymer-based formulation sandwiched between two electrode layers. The devices can be manufactured in panel form providing high quantities of devices which can be removed from the panel and applied directly to the component to be protected. Desired patterns can be formed on either one of the electrode layers by photo-etch techniques thereby providing a process that can be tailored to a large number of applications.

13 Claims, 6 Drawing Sheets

US 7,417,194 B2

ESD PROTECTION DEVICES AND METHODS OF MAKING SAME USING STANDARD MANUFACTURING PROCESSES

CROSS REFERENCE TO RELATED APPLICATIONS

Pursuant to 37 C.F.R. § 1.78, this application is related to and claims the benefit of earlier filing date of application Ser. No. 10/366,174 filed Feb. 13, 2003 now U.S. Pat. No. 6,981, 319 entitled "ESD Protection Devices and Methods of Making Same Using Standard Manufacturing Processes" naming common inventor Karen P. Shrier.

TECHNICAL FIELD

The present invention relates to electronic circuit protection devices and methods of making same. More particularly, the invention relates to the use of standard printed circuit board manufacturing processes for mass production of low profile polymer-based protection devices. Still more particularly, the invention relates to the manufacture of substrate-less protection devices that can be custom formed for use in a wide array of electronic circuit protection applications, such as electrostatic discharge and surge suppression, with possible implications toward the manufacture of a complete PCB protection system. Even still more particularly, the method of making such devices takes advantage of the vast know-how used in making printed circuit wiring boards and allows devices to be made in panels with features such as plated through-holes and multiple layers.

BACKGROUND OF THE INVENTION

The problems of static electricity and Electrostatic Discharge (ESD) are well known and documented. In general, such problems arise from the occurrence of electrical events that cause the transfer of charge from one material to another creating a surge in voltage due to voltage potential differences between the two materials. The Electrostatic Discharge Association (ESDA), for example, cites industry experts as estimating that product losses due to static range from 8-33%. According to the ESDA, others have estimated the actual cost of ESD damage to the electronics industry as running into the billions of dollars annually. See http://www.esda.org/basics/part1.cfm.

In general, prior art methods of protecting components from ESD damage include some basic precautions such as proper grounding or shunting that will "dissipate" or discharge transient signals away from the device to be protected. Still other methods include the use of packages and handling techniques that will protect susceptible devices during transport and shipping. While such techniques have been effectively used to shield the product from charge and to reduce the generation of charge caused by any movement of product within the container housing the device to be protected, they have not completely eliminated the risk of damage attributed to such disturbances. Moreover, it is well known that more modem devices operating in the higher frequencies (GHz and above) using submicron line widths are more susceptible to damage which can not be overcome using such methods.

Components designed to react to ESD events and provide a discharge path to ground are known in the arts. For example, U.S. Pat. No. 6,172,590 entitled "Over-voltage protection device and method for making same" to Shrier et. al (Ms. Shrier is a co-inventor to the '590 patent. The '590 patent is not commonly assigned to this application) describes a discrete electrical protection device that utilizes a gap between two electrically conductive members attached to an electrically insulating substrate. According to the '590 patent, the electrical protection device can be either surface mounted or built with through-holes for accommodating leads on an electrical connector. The '590 describes and claims methods for making an electrical protection device that includes an electrically insulating substrate.

U.S. Pat. No. 6,310,752 entitled "Variable voltage protection structures and method for making same" to Shrier et. al (Ms. Shrier is a co-inventor to the '752 patent. The '752 patent is not commonly assigned to this application) describes and claims a variable voltage protection component that includes a reinforcing layer of insulating material having a substantially constant thickness embedded in a voltage variable material. According to the '752 patent, the reinforcing layer defines a uniform thickness for the variable voltage protection component resistive to compressive forces that may cause a reduction in the clamp voltage or a short in the voltage variable material. The '752 patent also describes methods for making such a variable voltage protection component.

Prior art protection components, such as those incorporating the teachings of the '590 patent and the '752 patent, have been successfully made and used. Generally, such components utilize a couple of electrodes with some type of surge material interspersed between the electrodes. One electrode provides the transient signal input terminal while the other provides the discharge path to ground. A support layer known as the substrate or reinforcement layer is used to provide the necessary stiffness permitting the component to be surface mounted or through-holed.

Such prior art protection components, however, suffer from several limitations attributed to the requirement that a substrate or reinforcing layer be used. Specifically, the use of a substrate adds significantly to the component's overall size and cost. In addition, the relatively large size and profile of such prior art protection components makes their use impractical in tight spaces where board space is limited. Moreover, since the substrate material is a primary expense in the manufacture of such components, the use of prior art protection components on a widespread basis can be cost prohibitive. An example of such an application would be a multi-pin connector where ideally each pin would be protected from ESD events that could damage a device coupled to the connector. In such an application, a prior art ESD protection component could not be cost effectively used on each pin and, in most situations, would occupy too much board space and be too thick to be practical.

As electronic devices became faster and smaller, their sensitivity to ESD increases. ESD impacts productivity and product reliability in virtually every aspect of today's electronics environment. Many aspects of electrostatic control in the electronics industry also apply in other industries such as clean room applications and signal line proliferation.

Therefore, a need exists for a cost effective protection component that can be more widely used across a wider range of applications. A method of cost effectively manufacturing such a component would provide numerous advantages.

SUMMARY OF THE INVENTION

The present invention provides a cost effective method of manufacturing a substrate-less protection device. The invention also provide a innovative protection device that can be manufactured in high volumes without a substrate layer.

As such, disclosed is a method of manufacturing devices capable of protecting electronic components during the occurrence of a disturbance event, the method comprising the step of attaching a disturbance reacting substance to a first electrode. Next, the first electrode is positioned about a second electrode such that the disturbance reacting substance is interspersed in between. Finally, the first electrode, disturbance reacting substance, and second electrode are bonded to each other such that a three (3) layer structure for a protection device is created.

Also disclosed is a method manufacturing a panel of electronic component protection devices. The method comprises the steps of coating a first electrode layer with a liquid polymer formulation having a characteristic viscosity, drying the polymer formulation on the first electrode layer, and aligning the first electrode layer with a second electrode layer. Next, the first and second electrode layers are bonded to each other such that the liquid polymer formulation is interspersed between the first and second electrode layers thereby forming a panel from which a plurality of polymer-based protection devices can be obtained.

Further disclosed is a method of formulating a substance capable of reacting to a disturbance event, the method comprising the step of adding measured quantities of the following materials to a suitable polymeric solution: conductor, antioxidant, and insulator. Next, the materials are mixed within the polymeric solution until a desired viscosity level is achieved. In one embodiment, the adding step is performed using an epoxy solution that contains an approximate 75% solvent level.

An advantage of the present invention is that protection devices can be manufactured in high volumes using well known printed circuit board (PCB) manufacturing techniques. With the present invention, a panel holding anywhere from several hundred up to many thousand protection devices can be achieved with a combination of mixing, coating, curing, lamination, photo etch, and electroding steps. As a result, application specific designs can be readily customized and changes made quickly with minimal effort and expense.

Another advantage is that added capacitance can be limited by controlling the size of the electrode, formulation fillers and overall thickness of the devices.

Another advantage of the present invention is the achievement of a low profile protection device compared to the known prior art. For example, according to one embodiment a device profile of 5 mils is achievable compared to known prior art protection components that occupy between 15 and 30 mils.

Still another advantage of the invention is significant cost reductions compared to the prior art due primarily to the elimination of a substrate and use of printed wafer board technologies to create panels containing as many as 100,000 devices measuring 0603 mils and smaller.

And still another advantage is the ability to control the capacitance of the protection device by altering the nature of the filler characteristics utilized in the polymer. Depending on the restrictions placed on added capacitance for a given application, a polymer formulation with more or less capacitance can be utilized. In addition, minimum overlap can also be used to reduce added capacitance.

BRIEF DESCRIPTION OF THE DRAWINGS

The above and other advantages as well as specific embodiments will be understood from consideration of the following detailed description as well as the appended drawings in which.

References in the detailed description refer to like references in the figures unless otherwise indicated.

DETAILED DESCRIPTION OF THE PREFERRED EMBODIMENTS

The present invention provides a process of making a substrate-less protection device using standard printed circuit board (PCB) manufacturing techniques thereby allowing the manufacture of large number of devices relatively inexpensively. With the present invention, multiple ESD protection devices can be manufactured in panels that can be custom formed for an unlimited number of applications. It is believed that the process of the present invention has implications toward the manufacture of an all PCB protection system such as flex circuit with total ESD protection and/or as a layer in a PCB with protection provided for sensitive integrated circuits.

Figure 1:
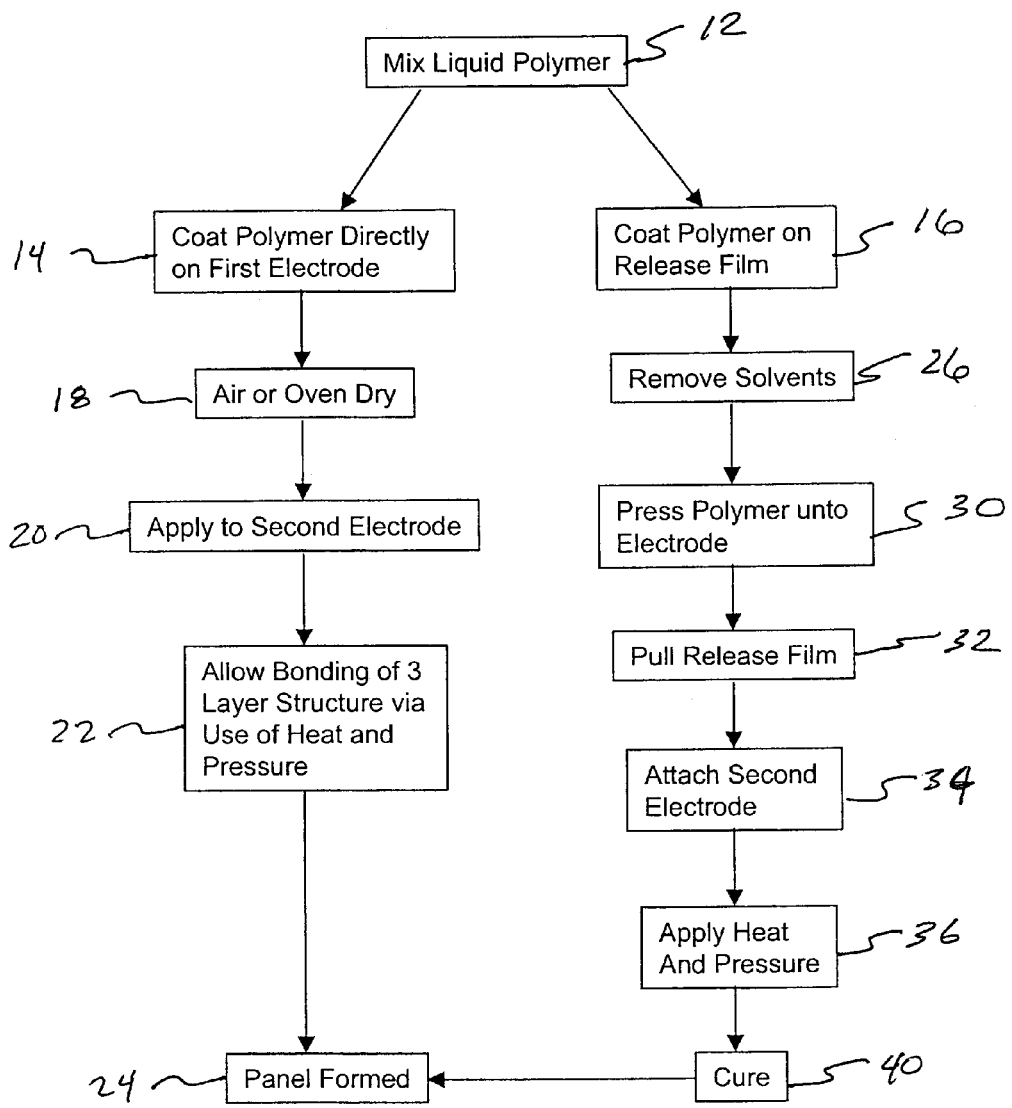
FIG. 1 is process flow diagram for the methods of the present invention according to two embodiments.

Manufacturing a Protection Device in Panels Gives Maximum Yield in High Quantities In general, the process of building a protection device according to the invention involves the use of a polymer-based formulation (or polymeric solution) that is coated directly on the electrodes forming the terminals of the protection device. As is well known, various materials can comprise the electrodes of a protection device such as copper, beryllium copper, nickel, gold, silver and others. The process described herein eliminates the need for a substrate or reinforcing layer to support the protection material. A disturbance reacting substance, such as a polymer, is formulated to be sensitive to a given disturbance event, such as an ESD or surge event, according to the application in which the protection device is used. The process of building such a component can be readily understood by reference to FIG. 1 which is flow diagram of the process, denoted generally as 10, of the present invention in its' most general sense. FIG. 1 shows that a substance capable of reacting to a disturbance, such as a polymer-based liquid, is prepared 12 such that the liquid has a characteristic viscosity that allows it to be coated onto, for example, an electrode material or release film. The stage viscosity, as is known and appreciated by those of ordinary skill in the art, is adjusted for coating and lamination. Therefore, by characteristic viscosity, the polymer is initially either a B or C stage liquid epoxy of the type known to those of ordinary skill. Next, after the liquid epoxy is formulated at step 12, it is then coated onto an electrode 14 or onto a release film 16 according to separate and alternate manufacturing processes both of which are part of the invention. In this regard, it should be understood that other polymers can be used to provide the breakdown functionality necessary to provide a discharge function in response to the occurrence of a disturbance event.

Figure 2:
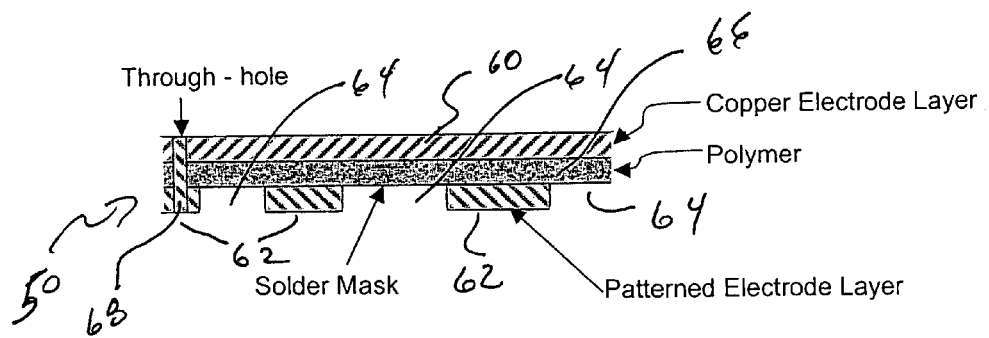
FIG. 2 shows a 3 layer structure for a device capable of protecting components made using the methods of the present invention.

At coating step 14, the polymer can be directly coated onto a variety of materials which can provide appropriate electrode structures such as, for example, a sheet of copper or a sheet of KAPTON pre-etched with a desired electrode pattern. Next, the polymer is B staged by allowing it to air dry on the electrode surface or by heating, step 18, so that the material can be further handled. Alternatively, the electrode and polymer can be placed in an oven. Since the material is in B stage, it can be applied to a second electrode, step 20, and bonded together, step 22, through the application of heat and pressure for a C stage cure. Thus, the polymer is sandwiched between two electrodes to form a very strong panel, step 24. The resulting structure is illustrated in FIG. 2.

The fact that a panel is formed at step 24 by sandwiching the polymer between two electrode means that no substrate or reinforcing layer is required thereby reducing significantly the cost of manufacturing.

Alternatively, using coating step 16, the polymer is coated unto a release film which supports the polymer prior to application on the electrode material. Preferably, the release film has the characteristic of being able to achieve a proper release of the coated polymer once it is applied to a second electrode. At this point, it may be useful to run the release film with polymer on electrode through an oven in order to remove solvents from the polymer, step 26. Sometimes, the release film and polymer can be run in an over prior to attachment to the electrode and lamination. If a coating line is used, it is likely that an oven is staged within the coating process to allow solvent dissipation. Also, a coating line allows continuous coating such that the polymer can be pumped directly on electrode or release film with high precision. The lamination or press process causes the polymer to adhere to the electrode layer.

Next, the electrode-polymer is pressed onto a second electrode, step 30, and the release film is pulled from the laminated structure, step 32, and a second electrode is attached, step 34. At this point, a three (3) layer structure has been formed consisting of one layer of polymer between two layers of electrode as shown in FIG. 2. The three (3) layer structure receives a second heat and pressure cycle, either through a coating line laminator or press, step 36, and allowed to cure, step 40. At this point, a relatively strong panel consisting of cured polymer sandwiched between the electrode layers is formed, step 24.

FIG. 2 shows a three (3) layer structure 50 with a first electrode 60 in the form of a copper electrode layer. Other electrode materials may be used. A second electrode 62 has been patterned to reveal spaces 64 thereby forming desired features. The spaces 64 can be utilized, for example, as a solder mask for attachment. As shown, first electrode 60 and second electrode 64 sandwich a disturbance reaching substance, in this case a polymer-based formulation 66, which is interspersed therein. The polymer-based formulation 66 is capable of creating a signal path for the first electrode 60 to the second electrode 62 in response to the occurrence of a disturbance event. In this case, a current path is formed via through-hole 68 which has been bored and soldered through the structure 50.

With either coating step 14 or 16, it is possible to coat the polymer directly on electrodes which have been preformed with features appropriate for a particular application. For example, it has been found that a thin sheet of electrode material (on the order of 0.7 to 2.8 mil copper) can be pre-formed with desired features thereon so that the resulting device fits the application. This can be done by etching a desired pattern on the electrodes prior to application of the polymer. For example, the outline of a press-fit washer (not shown) that fits snugly over a standard connector pin has been patterned using the process of the invention.

Thus, since adhesion is enhanced on the coated side of the electrode material, the present invention provides a means of forming correct patterns on a sheet of electrode material and coating it with a polymer to produce a protection device. Moreover, using standard PCB manufacturing processes, protection devices can be manufactured in large panels that consist of numerous protection devices thereby drastically reducing manufacturing costs compared to known prior art.

Figure 3:
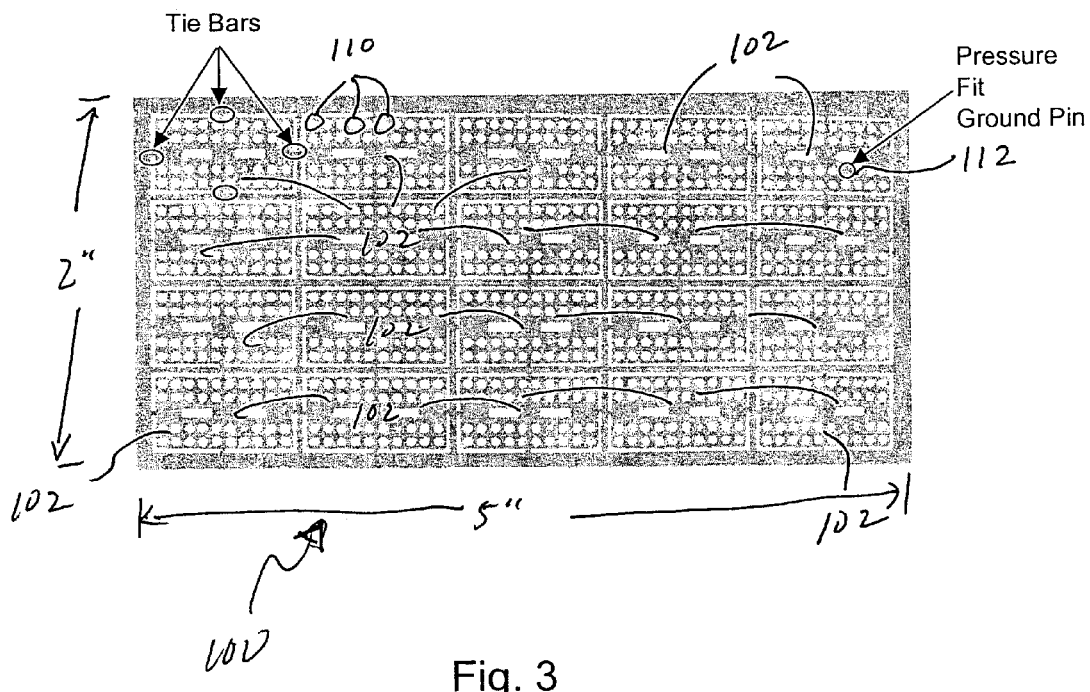
FIG. 3 shows a panel of device protection components according to the invention.

FIG. 3 shows an entire panel, denoted as 100, of protection devices made using the process of FIG. 1 as described herein. The panel of FIG. 3 shows that 20 connector arrays 102 can be obtained from a panel measuring approximately 2×5 inches. Each array 102 contains 40 structures including 39 protection devices 110 and a ground hole 112 resulting in a panel with approximately 800 devices. It should be understood, however, that panels of much larger size can be obtained using the process of the present invention to achieve panels accommodating tens of thousands of devices. In this way, the present invention provides significant cost reductions compared to the prior art due primarily to the elimination of a substrate and use of printed wafer board technologies (such as those used to create through-hole 68) to create panels, such as the panel of FIG. 3.

Figure 4:
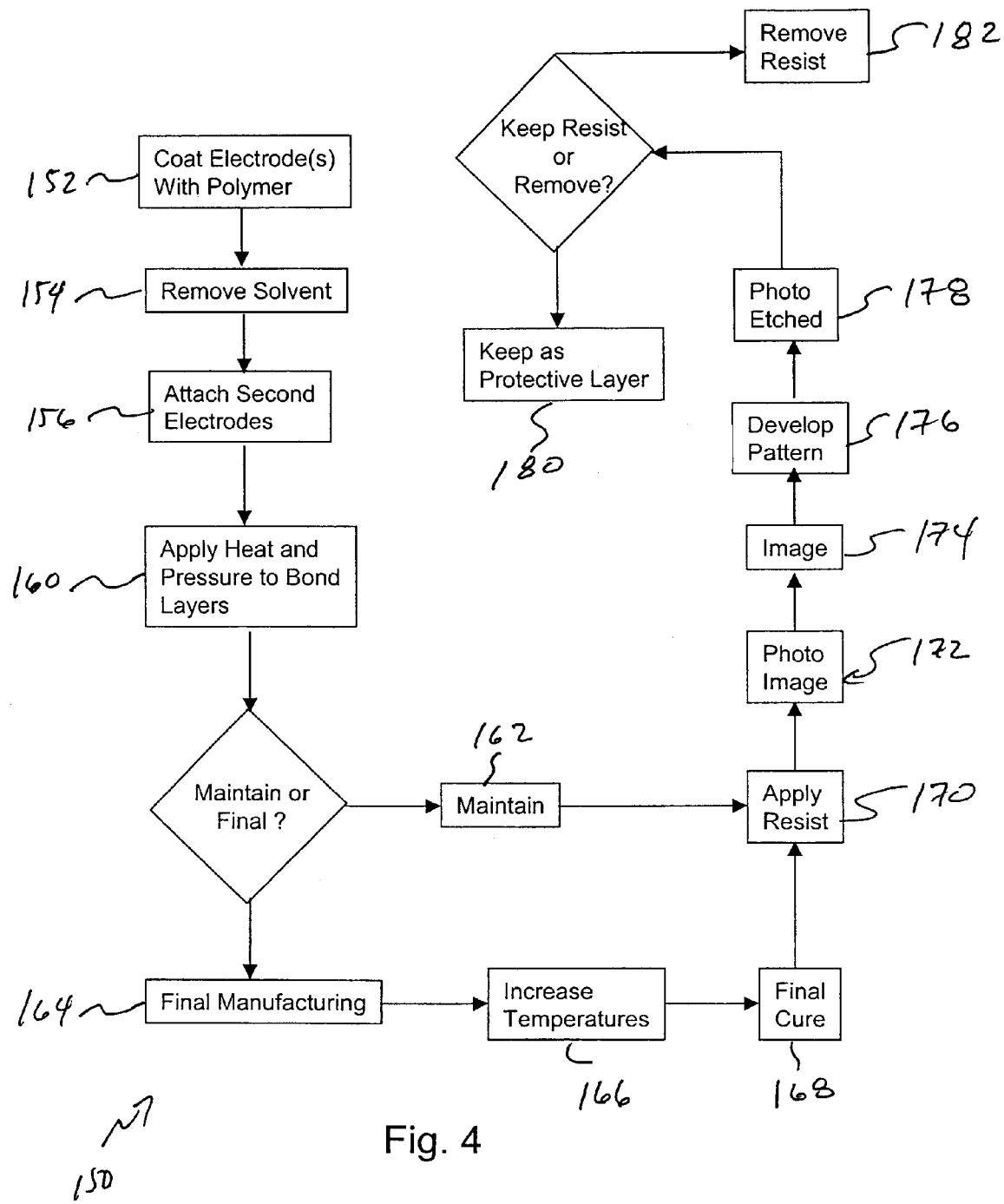
FIG. 4 is a process flow diagram for a method of utilizing PCB manufacturing techniques to create a protection device according to the invention.

With reference now to FIG. 4, therein is illustrated the process of the present invention according to one embodiment wherein features are etched after application of the polymer to the electrodes. In particular, it has been observed that manufacturing of protection devices according to the invention can be accomplished using well known Printed Circuit Board (PCB) manufacturing techniques after application of a polymer formulation, control of its thickness across the electrode surface, and subjecting the resulting electrode-polymer-electrode 3 layer structure to sufficient heat and pressure to achieve adhesion and bonding of the structure's layers. Of course, other suitable methods of polymer application, adhesion and bonding may be utilized all within the scope of the present invention.

Figure 7:
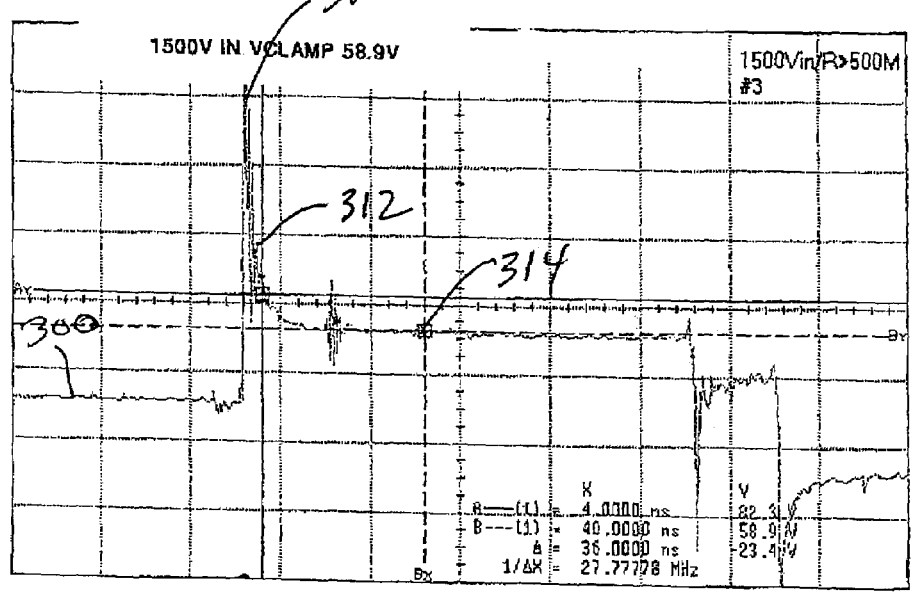
FIG. 7 shows the performance of a protection device according to one embodiment of the invention is shown.

As such, the process of FIG. 4, denoted generally as 150, starts out coating one or two electrodes with a polymer, step 152. In this regard, the terms "electrode" and "electrode layers" or "electrode surfaces" shall be used interchangeably throughout. The decision to coat one or two electrodes depends primarily on the desired thickness which, in turn, determines primarily the sensitivity of the polymer to a disturbance event. In general, the thicker the polymer the higher the threshold necessary to trigger its performance. In FIG. 7, the performance of a protection device according to one embodiment of the invention is shown.

Next, at step 154, solvents are removed from the polymer and the first electrode is then attached to a second electrode, step 156. Preferably, adhesion is achieved without the use of a separate adhesion layer. In one embodiment, this is accomplished using either a B or C stage epoxy which is part of the solution forming the polymer. Use of such an epoxy allows adhesion to occur at partial cure in combination with heat and pressure which is applied, step 160, to cause the electrode layers to be bonded. Remaining solvents can be accomplished by raising the temperature to approximately 120° Celsius which has been found to produce a B stage polymer. Thereafter, the electrodes can be maintained as is, step 162, or taken to final manufacturing, step 164, which involves increasing temperatures, step 166, which are applied to the structure and waiting for them to reach a final cure, step 168. At this point, the polymer is at C stage. For final manufacturing, an increase in temperature to approximately 180° Celsius has been found acceptable although this will vary with polymer.

Thus, the fact that a B or C stage epoxy (that is approximately 75% solvent and to which a number of fillers are added) is used provides a distinct manufacturing advantage in that low temperatures can be used to achieve good adhesion to the electrodes surrounding the polymer. This allows the cost effective manufacture of a laminated panel having a large number of devices as demonstrated by the panel 100 of FIG. 3.

Referring to FIG. 4, process 150 continues at step 170 which involves placing a layer of resist on the laminated panel. Next, a photo image corresponding to the desired pattern is placed over the resist, step 177, using well known PCB manufacturing techniques. Imaging can be done to both sides of the panel simultaneously. This allows the imaging, step 174, of a desired protection device pattern on the laminated panel for mass production of large number of devices well suited to a large number of applications. After imaging at step 174, the pattern is developed, step 176, and photo etched, step 178, using well known and cost effective PCB techniques.

It has been observed that after photo etching at step 178, the remaining resist can be left in tact, step 180, to serve as a protection layer or removed, step 182, for further processing. For example, in certain applications the photo resist can protect the electrode material during placement and mechanical attachment. An example of such an application would include a multiple pin connector such as that shown in FIG. 6. In other applications, the photo resist is removed for further processing of the devices which have been patterned to make the devices suitable for use in the final application. An example here would include the use of protection devices on a printed circuit board where a solder coating is applied to the electrodes to permit surface mounting of the devices. Alternatively, a conformal protective coating can be applied over each device resulting in a standard manufacturing package. It should be understood that other standard manufacturing techniques may be employed to accommodate application of the protection devices.

Figure 6:
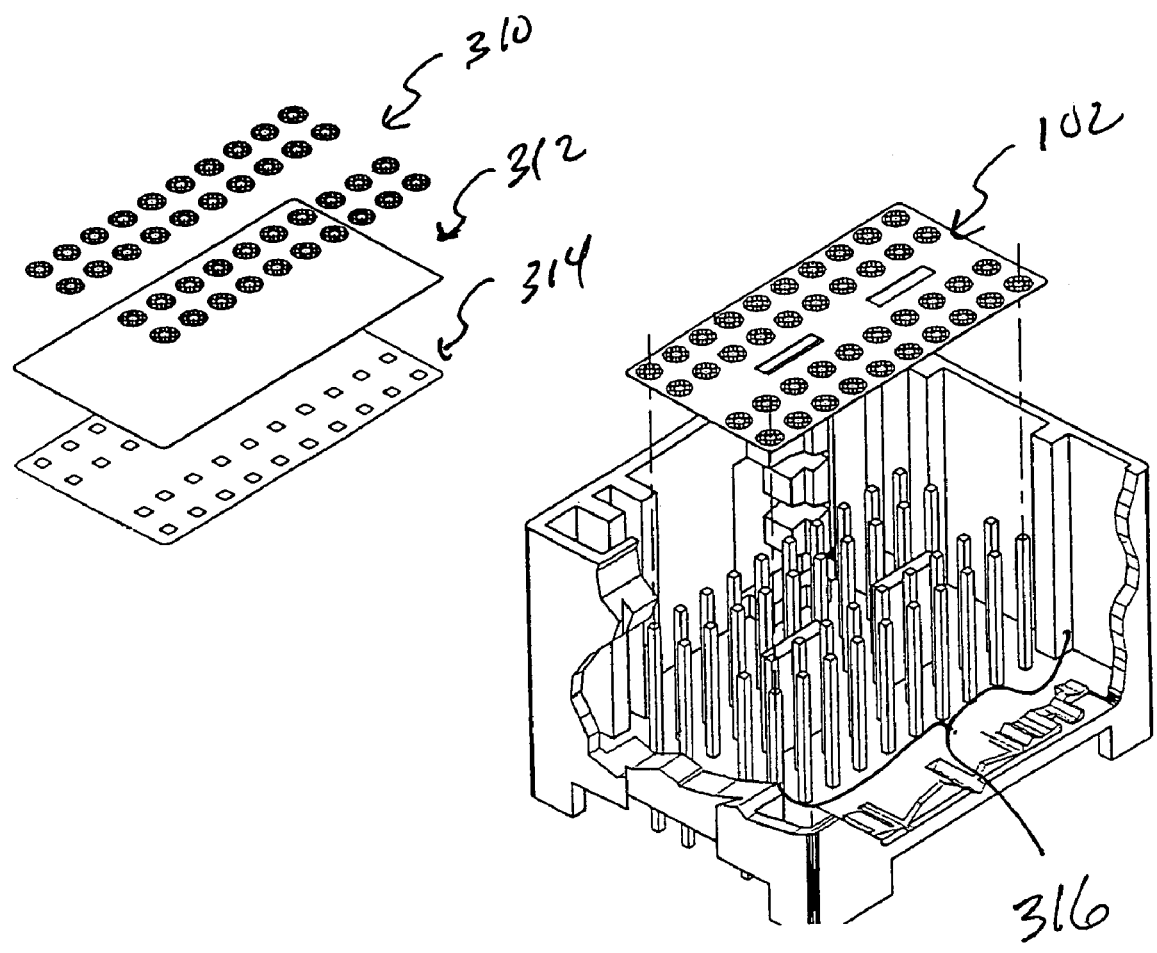
FIG. 6 show a multi-pin connector utilizing a protection devices according to the invention.

In FIG. 6, a multi-pin connector 300 is shown receiving an array, such as array 102, of protection devices according to the invention. The array 102 has been separated from a panel, such as panel 100, such that mechanical attachment to the connector is facilitated. As shown, an array consists of three layers 310, 312, 314 corresponding to the three layers of a structure formed using the processes of the present invention. The first layer 310 provides the first electrode and, as shown, consists of 40 individually formed devices which accommodate pins of the connector 300. It should be understood that many different patterns may be formed to suit other applications. Next, layer 312 is the disturbance reacting substance, such as a polymer-based formulation, which is sandwiched between layer 310 and layer 314. Layer 314 provides the attachment layer to the bottom of the connector 300 and provides a signal pathway to ground (via the ground pin not shown in FIG. 6) such that any one of the pins 316 can be protected during a disturbance event.

Pre-Etching of Pattern on Electrodes

As explained above and illustrated in the process figure diagrams, the use of a electrode allows the use of standard PCB manufacturing techniques. It is believed that an electrode-polymer-electrode layer can be interspersed as a separate layer within a PCB or that such a three (3) layer structure, as described and illustrated herein, can be laminated on top of a PCB thereby providing total board and board component protection. This would be accomplished by burying of an electrode-polymer-electrode layer within the PCB so that one electrode is coupled to inputs of the PCB and the other electrode forms a connection to ground (or a ground plane) of the PCB which is switched upon the detection of a disturbance event. In practice, electrode-polymer-electrode layer could be implemented using standard multi-layer PCB (layer in a board) layout techniques such as thru-holes and vias. This would also apply in flex circuit applications. If so, the electrode surfaces would be pre-etched along desired signal routes and traces in order according to the final board schematic and application. The first step would involve etching the electrode into whatever pattern is desired. Depending on the application, whether it's a washer, connector, or standard surface mount profile component (0603, 0402, 01206, or 0201 for example) both electrode layers would be etched. Since a B stage epoxy can be used, attachment of the electrode surfaces to each other can be readily accomplished with each pass of an electrode through a heat and pressure cycle.

KAPTON Provides Improved Rigidity

It has been found that a thin layer of copper provides an excellent electrode on which the polymer can be applied. According to another embodiment, the use of KAPTON has been found to be advantageous because of the increased mechanical stiffness it provides. In some designs, this results in less overall capacitance since the plate to plate overlap can be reduced due to the additional mechanical strength and rigidity provided by the KAPTON material. The reduced capacitance is desired in high frequency applications where added line capacitance can result in unwanted signal distortion. In addition, KAPTON provides increased strength and rigidity to the three (3) layer structure further enhancing handling during packaging and placement. Similar to the pre-etched process described above, a sheet or electrode material (such as copper) having a pre-etched KAPTON layer on one sure can be used. The KAPTON layer could be photo etched prior to lamination thereby providing the correct pattern for the particular application.

Figure 8A:
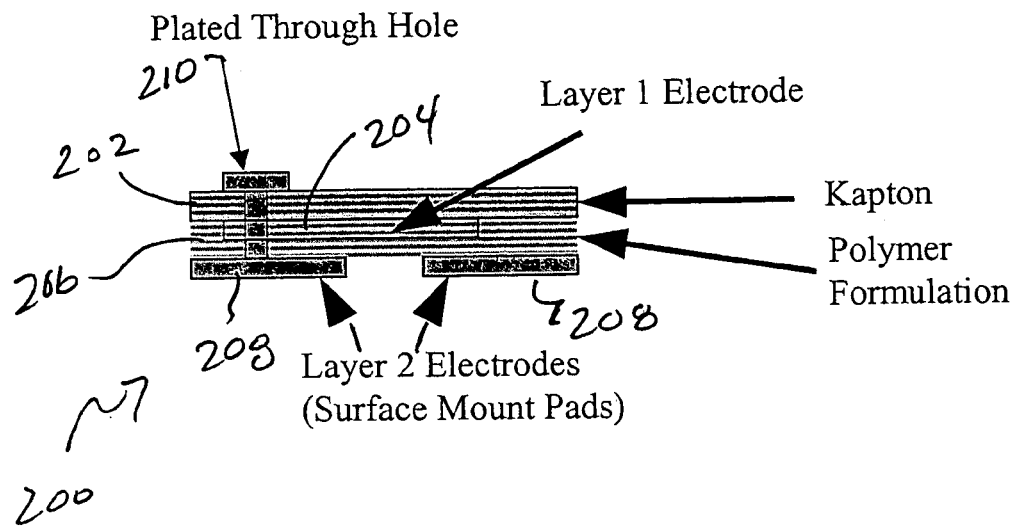
FIGS. 8a and 8b illustrating two embodiments of a protection device according to the invention, both of which utilize KAPTON, a polyimide produced by DuPont.
Figure 8B:
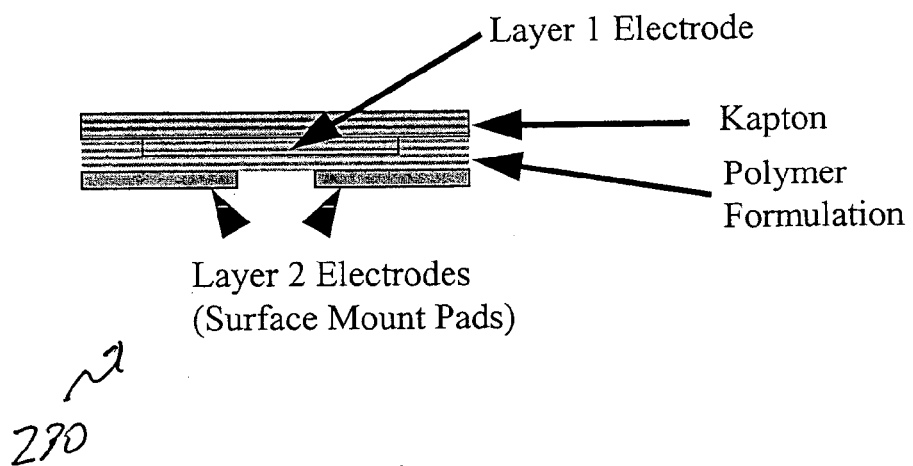

FIGS. 8a and 8b illustrate alternate embodiments of a protection device using KAPTON to increase rigidity. Specifically, the protection device 200 of FIG. 8a includes a full layer of KAPTON 202 surrounding a buried first electrode 204 that sandwiches polymer-based formulation 206 with second electrode 208. As before, a plated through-hole 201 provides the pathway between first electrode 204 and second electrode 208 for signal continuity when polymer-based formulation 206 achieves breakdown in response to a disturbance event. The physical dimensions of a device having the characteristics of protection device 200 can vary but on a 0603 (6 mils ×3 mils) has been constructed having a relative low trigger voltage that causes breakdown.

FIG. 8b illustrates a high voltage trigger of a protection device 230 according to the invention.

Since KAPTON is widely used as a pattered layer in many flexible circuit board designs, i.e. flex circuits, the use of an pre-etched KAPTON layer 208 allows further simplification of the manufacturing process while proving device protection in a multitude of flex circuit applications. The KAPTON/electrode layer can be laminated to a second electrode layer 202 coated with a polymer 206 which is sandwiched in between thereby forming a KAPTON/electrode-polymer-electrode structure. This eliminates the need for photo imaging with subsequent etching since the KAPTON would already include the desired pattern. Moreover, KAPTON increases the rigidity of the structure without the bulk and size limitations of a prior art substrate or reinforcement layer hereby keeping a relatively small profile for the entire device package. In short, until the present invention, no known way of providing total flex circuit device ESD protection was available.

Essentials of a Polymer

The present invention also provides a device, in the form of a pressed or laminated structure that is able to react to a disturbance event, such as Electrostatic Discharge (ESD) or voltage surge, with measured nano-second response times thereby providing a discharge path to ground that prevents damage to a protected component. It has been found that a polymer having application specific amounts of conductor dispersed with glass and Aluminum Oxide therein is capable of providing such a function. It is believed that such functionality results directly from a breakdown in the resistive properties of the polymer which provides a discharge path through the conductive material in the event a disturbance event occurs. Thus, the polymer can switch from an open to short circuit thereby discharging possible destructive signals away from a component to be protected. Compared with known prior art ESD protection methods, the use of such a polymer is vastly superior in performance and, using the manufacturing processes described above, can be manufactured in quantity and at relatively low costs. Finally, it has been verified that a protection component incorporating such a polymer is capable of withstanding multiple ESD events as well as with over voltages greater than ESD and other disturbance events.

In general, formulating a polymer with these characteristics involves consideration of two primary aspects: viscosity and control of formulation properties.

Viscosity

The key variable is the use of a polymer having sufficient viscosity. Viscosity provides better dispersion and holds suspension. No precise or exact measure of viscosity can be specified although it can be compared to a thick molasses or paste. A thickness has a direct impact on trigger voltage sensitivity, i.e. the voltage at breakdown of the insulating properties of the polymer is achieved and at which the polymer switches from an open to a short, the thickness of the material is directly related to performance. In general, the thicker the polymer, the greater the trigger voltage that must be applied in order to cause a breakdown. The addition of more conductor can be used to lower the breakdown voltage of the material. This means that less tolerant devices would utilize a protection device with a thinner layer of polymer while more durable devices can utilize a thicker layer. Ultimately, using the processes described above, the aim is to have a liquid that draws evenly when processed through a coating machine, on a screen printer or laminator. A polymer according to the invention must possess the characteristic quality of being able to be spread out to achieve a fairly uniform coat across the surface on which it is placed.

Figure 5:
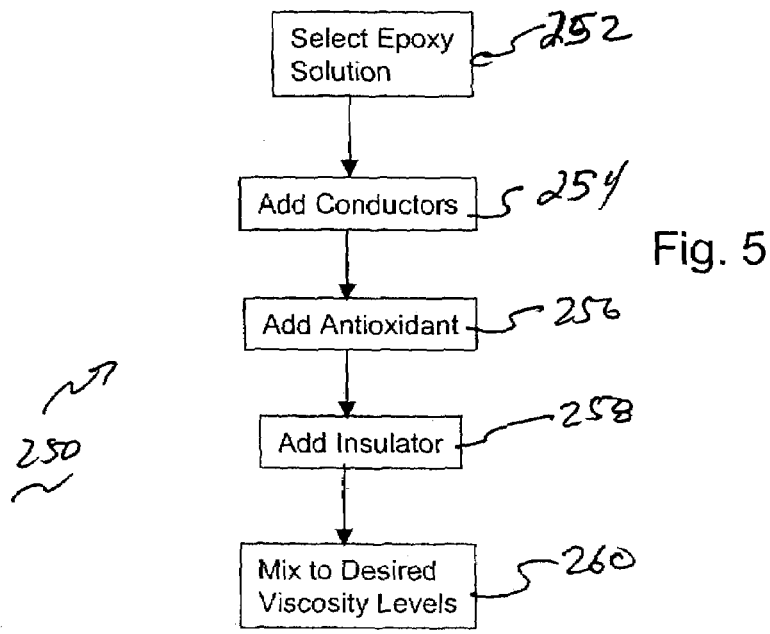
FIG. 5 is a process flow diagram for a polymer formulation process that can be used to create a polymer-based protection device according to the invention.

To better understand the formulating of a polymer with the desired criteria, reference is made to FIG. 5 which illustrates a formulation process, denoted generally as 250, for preparing such a polymer. Process 250 involves the selection of a suitable polymeric solution, such as an epoxy, having a desired solvent level, step 252. For many applications, it has been found that an epoxy with an approximately 75% solvent level is satisfactory but this is only an example and should not limit the invention in any way. An example of such an Epoxy includes the Scotch-Weld™ Epoxy Adhesive/Coating 2290 by 3M (Refer to Technical Data Sheets dated June 2000 available from the 3M Company; 3M claims Scotch-Weld as its trademark) although it is believed that the process will also work using a thermoset, thermoplastic, as well as other polymers such as polyethylenes, liquid crystal polymers, and acrylates.

Next, conductive materials are added to the epoxy, step 254, along with an antioxidant, step 256, an insulator, step 258, and the resulting solution is mixed, step 260, until a desired viscosity level and relative dispersion of the particles has been attained. It should be understood that variants in this process are contemplated including, for example, the use of thin liquids, liquid and solid polymers.

In this way, the solution goes from an almost freely flowing liquid state to a liquid having a very high viscosity. Again, no precise measure of viscosity nor mixing period can be specified, but the process 250 can be applied to achieve a suitable polymer that is application specific with subsequent verification of performance largely a matter of trial and error. In practice, an automated commercial mixer can be used to facilitate mixing of the solution to the desired viscosity.

In general, the conductor, antioxidant and insulator comprise very small particles that can be mixed to achieve a relatively uniform consistency. One known insulating material comprises antioxidants which add to the resistive properties of the polymer and helps separate the conductive particles from each other such that an open circuit is provided during normal operation. Therefore, a suitable formulation of a polymer according to one embodiment would consist of the following components by vol. %:

67% epoxy
0.1% Aluminum
4.9% Glass Beads (Potter Industries)
28% Aluminum oxide

Since capacitance of the formulation is largely a byproduct of the filler materials mixed in the polymer, variations in filler type, size and quantity have been observed to effect the capacitance of the polymer. Therefore, depending on the restrictions which a particular application may have in terms of added capacitance, the filler type, size and quantity may be altered to guarantee a relatively uniform level range of capacitance values from one device to another within a panel.

Coating Methods

Coating of the polymer can be accomplished by either screen printing or by direct coating using a coating line. The major difference between the two processes lies in the way the polymer is dispensed unto the electrode. With a screen printer, the polymer is dumped unto the electrode surface and spread across the surface. Comparatively, on the coating line, the material is extruded through a die head and the electrode surface is passed about an area where the die head pumps the polymer over the electrode resulting in an extremely uniform precision control of the coating process and the option to coat on a continuous basis. Alternate coating line processes can also be used such as gravure rollers, for example.

Conductor Dispersion

It has been found that a variety of conductors can be mixed into the solution including aluminum, aluminum oxide, and tungsten, a material with a very high melting point, as well as other conductive materials. Uniform dispersion of the conductor, however, should be attained which is easy to achieve given the relatively low viscosity of epoxy solvent solution prior to mixing. The capability for mixing these materials has been demonstrated using tungsten, aluminum, and silver coated glass beads as conductive particles. Specifically, it has been observed that the use of aluminum oxide as a conductor drops the trigger voltage of the polymer. In essence, being able to use a variety of conductors, the distance between the particles can be controlled and maintained very close, thereby defining a relationship between spacing of the particles and trigger voltage.

The fact that a variety of conductors can be used provides flexibility in design since different application may require different trigger levels. Moreover, conductors do not have to be coated in order to influence their performance within the solution as the quantity of conductor can be controlled and dispersed to effect performance.

Curing Epoxies

Curing

The transition period of an epoxy mixture from a liquid to a solid is generally labeled the cure time. It can be divided into three phases—open time or wet lay-up time (liquid state), initial cure (gel state) and final cure (solid state). The speed of the reaction (and the length of these phases and the total cure time) varies relative to the ambient temperature.

Other Applications

It is anticipated that the methods of the present invention will have application to the manufacture of other than protection devices. For example, the process may suggest ways of manufacturing widely used passive components such as resistors and capacitors, by changing the nature of the active fillers within the polymer formulation. For resistors, the added filler material can be carbon-based while tantalum may be used for capacitors.

FIG. 7 is a graph illustrating the performance of a sample protective device according to the invention. As above, the input voltage 300 goes from a nominal operating value to a spike 310 which mimics the occurrence of a disturbance event. This could be replaced using a pulse generator having a 50 ohm transmission line output capable of generating at least a 1500 V waveform (able to deliver a 30 amp square wave pulse to stimulate an 8000 V double exponential ESD pulse.) The device is triggered by the voltage spike 310 and, after breakdown, current through the device safely flows to ground as indicated by the fulling side of the spike waveform. Eventually, the output of the device clamps at point 314 representing the clamping voltage of the protection device, a level that is presumably safe for the component being protected.

Use of Nanoparticles

It has been found that the use of nanometer sized aluminum particles provides some particular advantages in that no aluminum nor aluminum oxide is required to be added as a separate step. For example, such nano-sized particles are available from TECHNANOGY and consist of 46.1 nm sized aluminum particles (i.e. aluminum powder) with 63.7% nano-aluminum and the remainder consisting of aluminum oxide. In addition, it has been observed that for an 0603 device, the overall added capacitance is decreased by almost half using such nano sized particles.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. It is therefore intended that the appended claims encompass any such modifications or embodiments.

What is claimed is:

1. A device for protecting an electronic component during the occurrence of a disturbance event comprising:
    a polymer-based formulation;
    a first electrode located on a first side of the polymer-based formulation and having an exposed surface opposite the first side of the polymer-based formulation; and
    a second electrode arrayed on a second side of the polymer-based formulation and having an exposed surface opposite the second side of the polymer-based formulation,
    wherein the polymer-based formulation is capable of creating a signal path from the first electrode in response to the occurrence of a disturbance event.

2. The device according to claim 1 where in said first and second electrodes comprise layers made from a conductive material.

3. The device according to claim 1 wherein said conductive material is chosen from a group consisting of: copper, beryllium copper, nickel, gold, or silver.

4. The device according to claim 1 wherein the device comprises a panel.

5. The device according to claim 1 wherein the first electrode comprises a repeating pattern of electrodes.

6. The device according to claim 1 further comprises a through-hole coupling said first electrode to said second electrode and providing a signal path during a disturbance event.

7. The device according to claim 1 further comprises a layer of polyimide coupled to said first electrode.

8. The device according to claim 1 wherein said polymer-based formulation comprises a polymer having conductors, an antioxidant, and an insulator mixed therein.

9. The device according to claim 1 wherein said polymer-based formulation comprises of a polymer having nano-sized aluminum particles mixed therein.

10. An electrostatic discharge protection device comprises:
    a first layer of a polymer-based voltage-responsive material;
    a second layer of conductive material disposed on the first layer; and
    conductive contact pads disposed on a second side of the first layer, wherein the first, second, and third layers together form an unsupported laminate structure.

11. The device of claim 10, wherein the device is independent of a rigid substrate.

12. The device claim 10, wherein the first layer is configured to create a signal path from one or more of the contact pads to the second layer in response to the occurrence of a disturbance event.

13. The device of claim 10, wherein the polymer-based voltage responsive material comprises an epoxy.

* * * * *

UNITED STATES PATENT AND TRADEMARK OFFICE
CERTIFICATE OF CORRECTION

PATENT NO.        : 7,417,194 B2
APPLICATION NO. : 10/875372
DATED               : August 26, 2008
INVENTOR(S)      : Karen Shrier It is certified that error appears in the above-identified patent and that said Letters Patent is hereby corrected as shown below:

Column 12, line 16, in Claim 1, delete "the" and insert -- said --, therefor.

Column 12, line 17, in Claim 1, after "electrode" insert -- to said second electrode --.

Column 12, line 22, in Claim 3, delete "1" and insert -- 2 --, therefor.

Column 12, line 23, in Claim 3, delete "a" and insert -- the --, therefor.

Column 12, line 29, in Claim 6, delete "comprises" and insert -- comprising --, therefor.

Column 12, line 32, in Claim 7, delete "comprises" and insert -- comprising --, therefor.

Column 12, line 38, in Claim 9, after "comprises" delete "of".

Column 12, line 40, in Claim 10, delete "comprises:" and insert -- comprising: --, therefor.

Column 12, line 43, in Claim 10, after "of" insert -- a --.

Column 12, line 43, in Claim 10, after "on" insert -- a first side of --.

Column 12, line 45, in Claim 10, before "conductive" insert -- "a third layer of" --.

Column 12, line 50, in Claim 12, after "device" insert -- of --.

Signed and Sealed this

Eleventh Day of November, 2008

JON W. DUDAS
*Director of the United States Patent and Trademark Office*